US009635774B2

(12) United States Patent
Abee

(10) Patent No.: US 9,635,774 B2
(45) Date of Patent: Apr. 25, 2017

(54) ELECTRICAL APPARATUS AND ELECTRICAL ENCLOSURE THEREFOR

(71) Applicant: EATON CORPORATION, Cleveland, OH (US)

(72) Inventor: Brandon Matthew Abee, Fletcher, NC (US)

(73) Assignee: EATON CORPORATION, Cleveland, OH (US)

( * ) Notice: Subject to any disclaimer, the term of this patent is extended or adjusted under 35 U.S.C. 154(b) by 0 days.

(21) Appl. No.: 14/826,404

(22) Filed: Aug. 14, 2015

(65) Prior Publication Data

US 2017/0048999 A1 Feb. 16, 2017

(51) Int. Cl.
H05K 5/00 (2006.01)
H05K 5/02 (2006.01)
H05K 5/03 (2006.01)

(52) U.S. Cl.
CPC ............ *H05K 5/03* (2013.01); *H05K 5/0017* (2013.01); *H05K 5/0226* (2013.01); *H05K 5/0247* (2013.01)

(58) Field of Classification Search
CPC ...... H05K 5/03; H05K 5/0226; H05K 5/0247; H05K 5/0017
USPC ................. 361/679.01, 724, 726; 312/223.1; 211/26
See application file for complete search history.

(56) References Cited

U.S. PATENT DOCUMENTS

| 4,710,590 | A | * | 12/1987 | Ekdahl | ................. H05K 9/0015 |
| | | | | | 174/355 |
| 6,512,669 | B1 | * | 1/2003 | Goodwin | ............. H02B 13/025 |
| | | | | | 200/50.12 |
| 2007/0160178 | A1 | | 7/2007 | Walker et al. | |
| 2008/0148642 | A1 | * | 6/2008 | Mathieu | .................... E05C 9/02 |
| | | | | | 49/395 |
| 2009/0173118 | A1 | | 7/2009 | Schulz et al. | |
| 2009/0307983 | A1 | * | 12/2009 | Nelson | ..................... H04Q 1/10 |
| | | | | | 49/479.1 |
| 2010/0208433 | A1 | * | 8/2010 | Heimann | ................. H04Q 1/10 |
| | | | | | 361/724 |
| 2013/0257256 | A1 | * | 10/2013 | Allard | ................... F25D 23/062 |
| | | | | | 312/406 |

FOREIGN PATENT DOCUMENTS

| JP | S51 82928 U | 7/1976 |
| JP | S54 145943 A | 11/1979 |
| WO | 03/105552 A2 | 12/2003 |

* cited by examiner

*Primary Examiner* — Anthony Haughton
*Assistant Examiner* — Yahya Ahmad
(74) *Attorney, Agent, or Firm* — Eckert Seamans; John Powers; Philip Levy

(57) ABSTRACT

An electrical enclosure is for an electrical apparatus. The electrical apparatus includes a number of electrical components. The electrical enclosure comprises: a frame assembly comprising a frame member having an elongated hinge side portion; a door having an elongated hinge side portion disposed parallel to and proximate the hinge side portion of the frame member, the door and the frame assembly being structured to enclose the number of electrical components; and a containment apparatus comprising a flexible barrier member coupled to the hinge side portion of the frame member and the hinge side portion of the door in order to provide a seal therebetween.

18 Claims, 9 Drawing Sheets

ELECTRICAL APPARATUS AND ELECTRICAL ENCLOSURE THEREFOR

BACKGROUND

Field

The disclosed concept relates to electrical apparatus such as, for example, motor starters. The disclosed concept further relates to electrical enclosures for electrical apparatus.

Background Information

Electrical apparatus such as, for example, motor starters are often used to provide protection and control for a load, such as a single-phase or three-phase motor and the like, typically used in, for example, various industrial settings to operate machinery. Safety is a primary concern in the electrical industry. One point of focus relates to electrical safety with respect to uncontrolled arc flash events within motor starters. Arc flash is a dangerous condition associated with the explosive release of energy caused by an electrical arc (e.g., arcing event). This fault can result from many factors including, for example and without limitation, dropped tools, accidental contact with electrical systems, buildup of conductive dust, corrosion, or improper work procedures. A relatively minor event initiated within a motor control center subunit, for example, caused by a flash over to ground, could quickly propagate into a phase-to-phase fault and then a full blown three phase arcing fault, with the arc potentially jumping to the line side of the subunit circuit breaker or fuse.

During the arc flash, the arc gases and debris seek any available path to escape the motor starter. Additionally, pressure is applied to the door of the motor starter, thus causing the door to deform. As a result, during an arc flash event, the arc gases and debris often escape along the perimeter of the door, thereby presenting a serious safety hazard.

There is thus room for improvement in electrical apparatus and in electrical enclosures therefor.

SUMMARY

These needs and others are met by embodiments of the disclosed concept, which are directed to an electrical apparatus and electrical enclosure therefor, in which a barrier member provides a seal between a door and a frame member of the electrical enclosure.

In accordance with one aspect of the disclosed concept, an electrical enclosure for an electrical apparatus is provided. The electrical apparatus includes a number of electrical components. The electrical enclosure comprises: a frame assembly comprising a frame member having an elongated hinge side portion; a door having an elongated hinge side portion disposed parallel to and proximate the hinge side portion of the frame member, the door and the frame assembly being structured to enclose the number of electrical components; and a containment apparatus comprising a flexible barrier member coupled to the hinge side portion of the frame member and the hinge side portion of the door in order to provide a seal therebetween.

In accordance with another aspect of the disclosed concept, an electrical apparatus comprises: a number of electrical components; and an electrical enclosure comprising: a frame assembly comprising a frame member having an elongated hinge side portion, a door having an elongated hinge side portion disposed parallel to and proximate the hinge side portion of the frame member, the door and the frame assembly enclosing the number of electrical components; and a containment apparatus comprising a flexible barrier member coupled to the hinge side portion of the frame member and the hinge side portion of the door in order to provide a seal therebetween.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1:
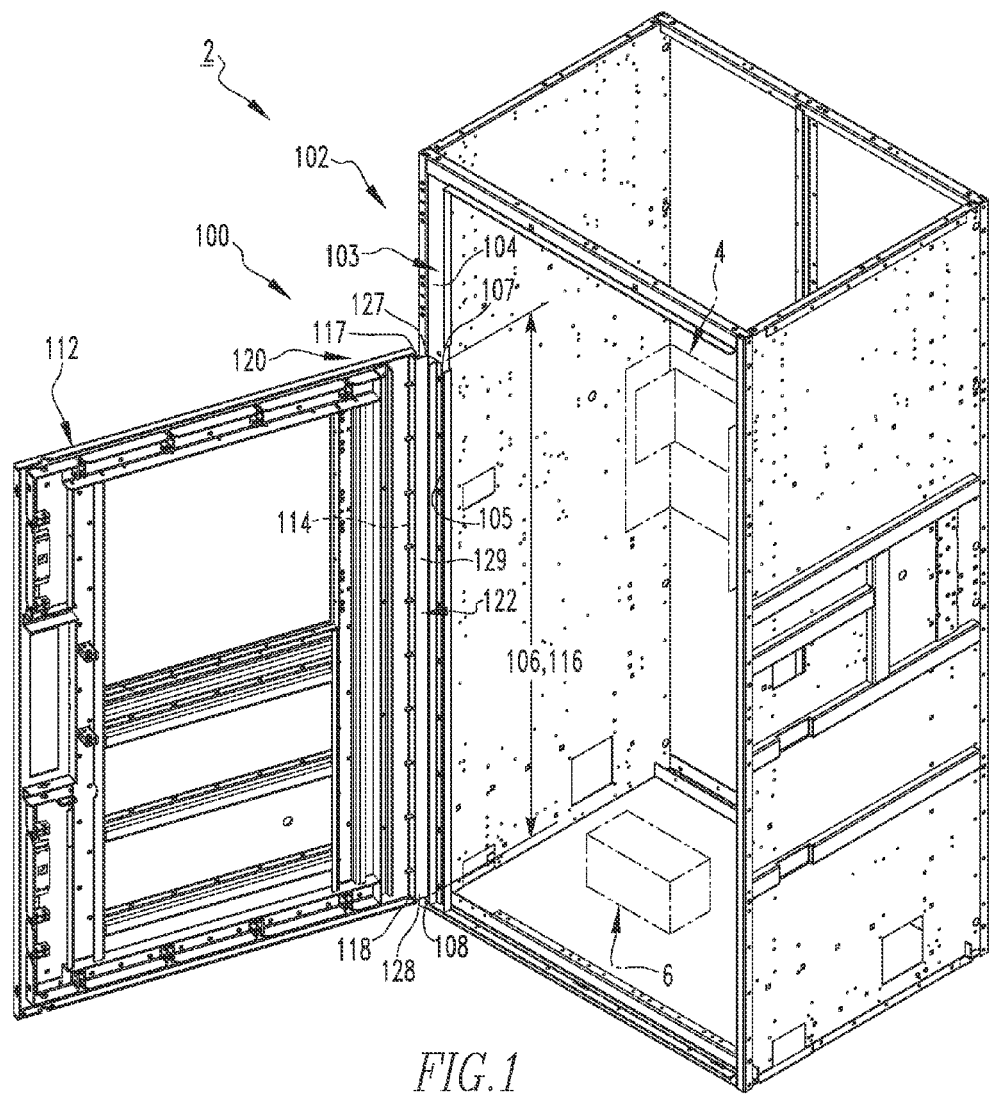
FIG. 1 is a simplified isometric view of an electrical apparatus and electrical enclosure therefor, shown with the door open, in accordance with a non-limiting embodiment of the disclosed concept.

For purposes of the description hereinafter, directional phrases used herein such as, for example, "right," "left," "top," "bottom," "up," "down," and derivatives thereof shall relate to the disclosed concept, as it is oriented in the drawings. It is to be understood that the specific elements illustrated in the drawings and described in the following specification are simply exemplary embodiments of the disclosed concept. Therefore, specific orientations and other physical characteristics related to the embodiments disclosed herein are not to be considered limiting with respect to the scope of the disclosed concept.

As employed herein, the term "number" shall mean one or an integer greater than one (i.e., a plurality).

As employed herein, the statement that two or more parts are "connected" or "coupled" together shall mean that the parts are joined together either directly or joined through one or more intermediate parts.

As employed herein, the statement that two or more parts or components "engage" one another shall mean that the parts touch and/or exert a force against one another either directly or through one or more intermediate parts or components.

As employed herein, the term "coupling member" refers to any suitable connecting or tightening mechanism expressly including, but not limited to, rivets, screws, bolts and the combinations of bolts and nuts (e.g., without limitation, lock nuts) and bolts, washers and nuts, zip ties, and wire ties.

FIG. 1 shows a simplified view of an electrical apparatus (e.g., without limitation, motor starter 2), in accordance with a non-limiting embodiment of the disclosed concept. The example motor starter 2 includes a number of electrical components 4,6 (shown in simplified form) and an electrical enclosure 100. The electrical enclosure 100 includes a frame assembly 102, a door 112, and a containment apparatus 120. When the door 112 moves to the closed position (FIGS. 4 and 5), the door 112 and the frame assembly 102 are structured to enclose the electrical components 4,6 therewithin. Continuing to refer to FIG. 1, the frame assembly 102 includes a frame member 103 coupled to the door 112. The frame member 103 has a surface 104 having an elongated hinge side portion 105 and an access opening to allow access to the electrical components 4,6. The door 112 has an elongated hinge side portion 114 located parallel to and proximate the hinge side portion 105. Additionally, the hinge side portions 105,114 are spaced from one another such that there is an opening therebetween.

During an arc flash event, potential hot gases and debris attempting to exit the motor starter 2 follow a flow path that first passes through the access opening of the frame member 103. As will be discussed below, during such an arc flash event, the containment apparatus 120 is advantageously structured to prevent the potential hot gases and debris from further passing through the opening between the hinge side portions 105,114, thereby improving safety to operating personnel. This is distinct from prior art electrical apparatus/enclosures (not shown) in which the potential hot gases and debris given off during an arc flash event are easily able to escape through an opening between corresponding hinge side portions.

Figure 2:
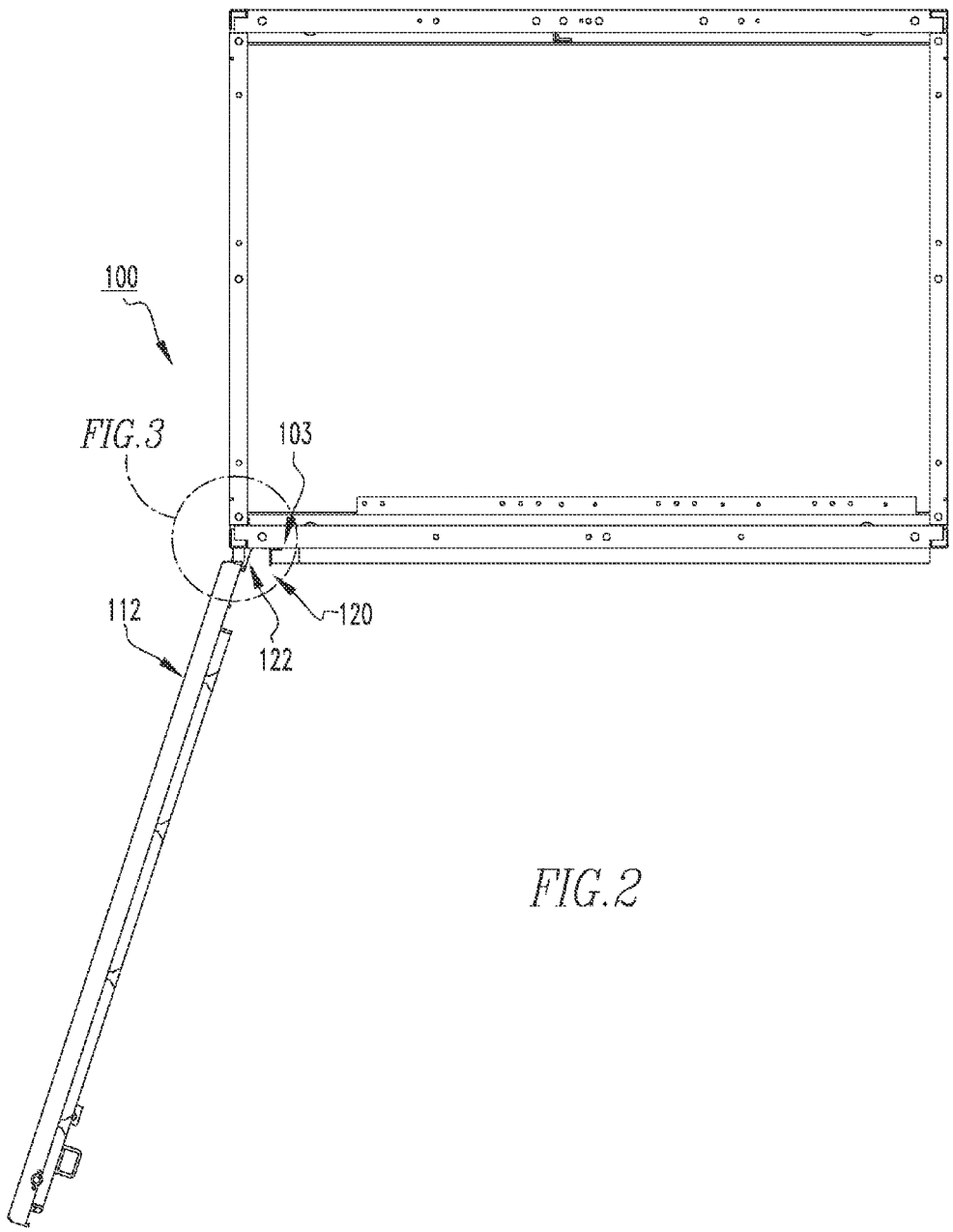
FIG. 2 is a top plan view of the electrical enclosure of FIG. 1.
Figure 3:
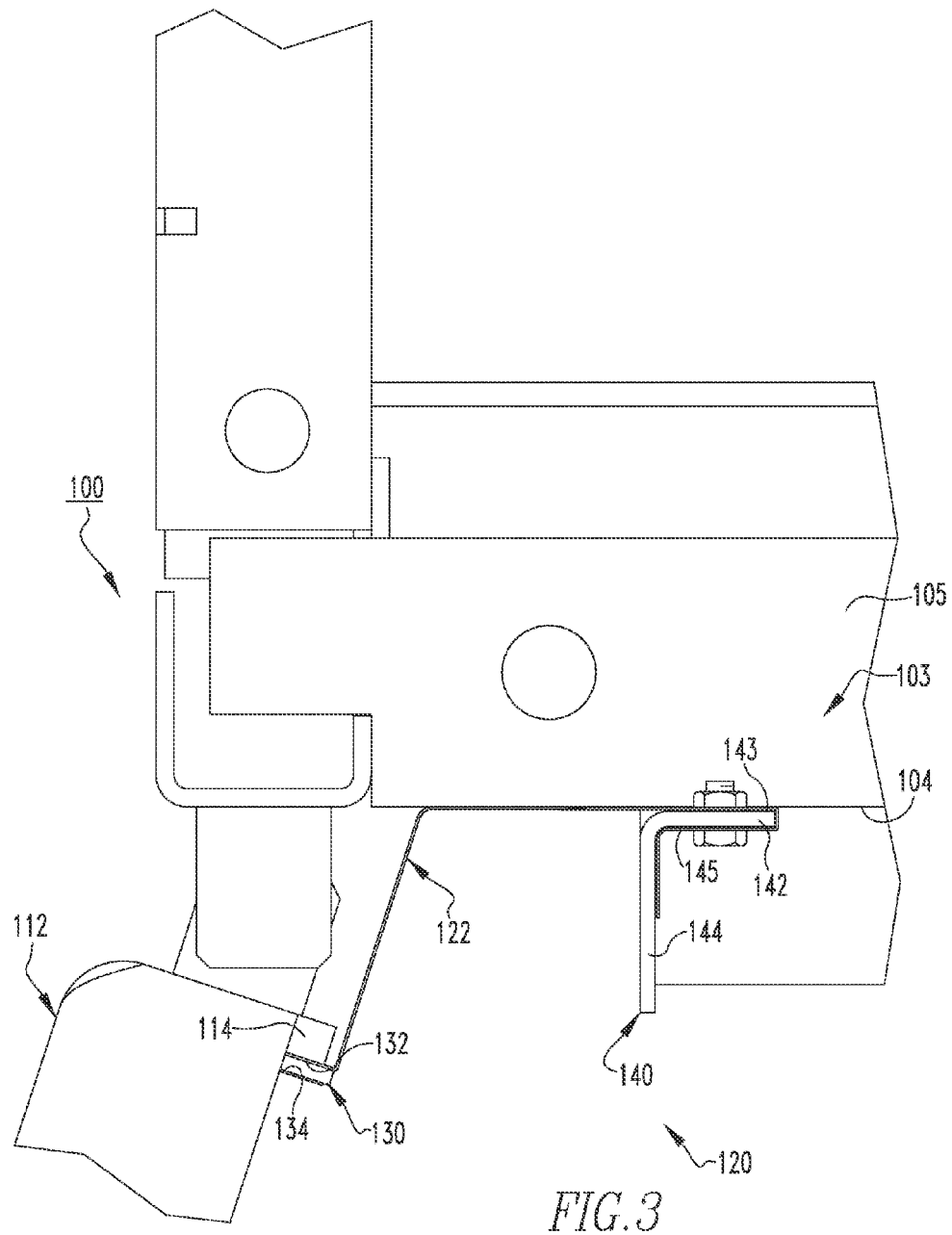
FIG. 3 is an enlarged view of the electrical enclosure of FIG. 2.

As shown in the top views of FIGS. 2 and 3, the containment apparatus 120 includes a flexible barrier member 122, a first retention member 130 (partially shown in FIG. 3), and a second retention member 140. The flexible barrier member 122 is made of a suitable material that is substantially impervious to the flow of hot gases and debris therethrough (e.g., without limitation, made of Kevlar). Additionally, the flexible barrier member 122 is coupled to the hinge side portion 105 of the frame member 103 and the hinge side portion 114 of the door 112 in order to provide a seal therebetween. In other words, the flexible barrier member 122 is structured to prevent potential hot gases and debris from exiting the electrical enclosure 100 via the space between the hinge side portions 105,114.

The first retention member 130 is coupled to the hinge side portion 114 of the door 112 in order to retain the flexible barrier member 122 thereon. The second retention member 140 has an L-shaped cross-section, and includes a first planar portion 142 and a second planar portion 144 perpendicular to the first planar portion 142. The first planar portion 142 is coupled to the hinge side portion 105 of the frame member 103 in order to retain the flexible barrier member 122 thereon. The first planar portion 142 extends from the second planar portion 144 toward the access opening of the frame member 103 (FIG. 1).

Figure 4:
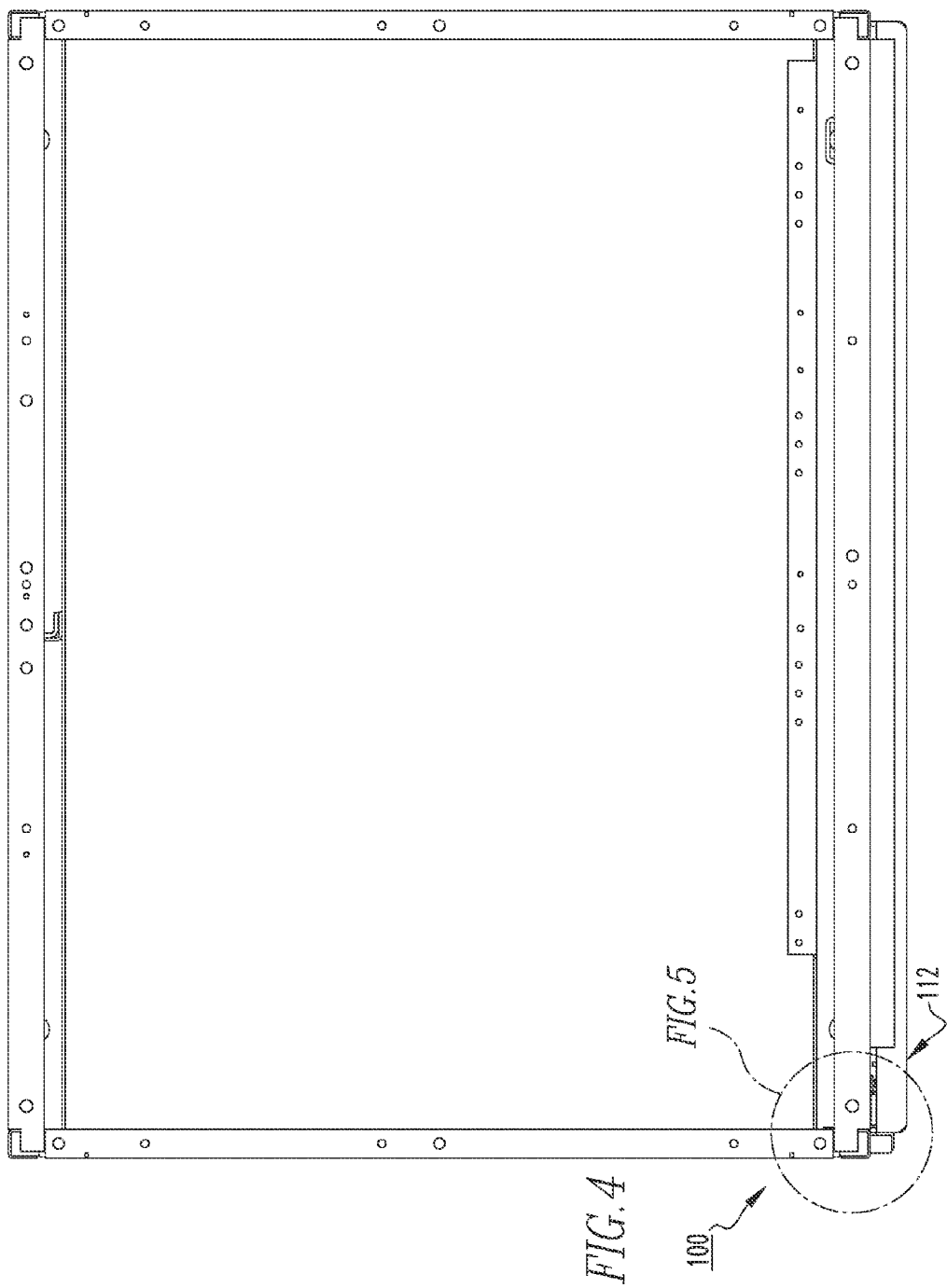
FIG. 4 is a top plan view of the electrical enclosure of FIG. 1, shown with the door closed.
Figure 5:
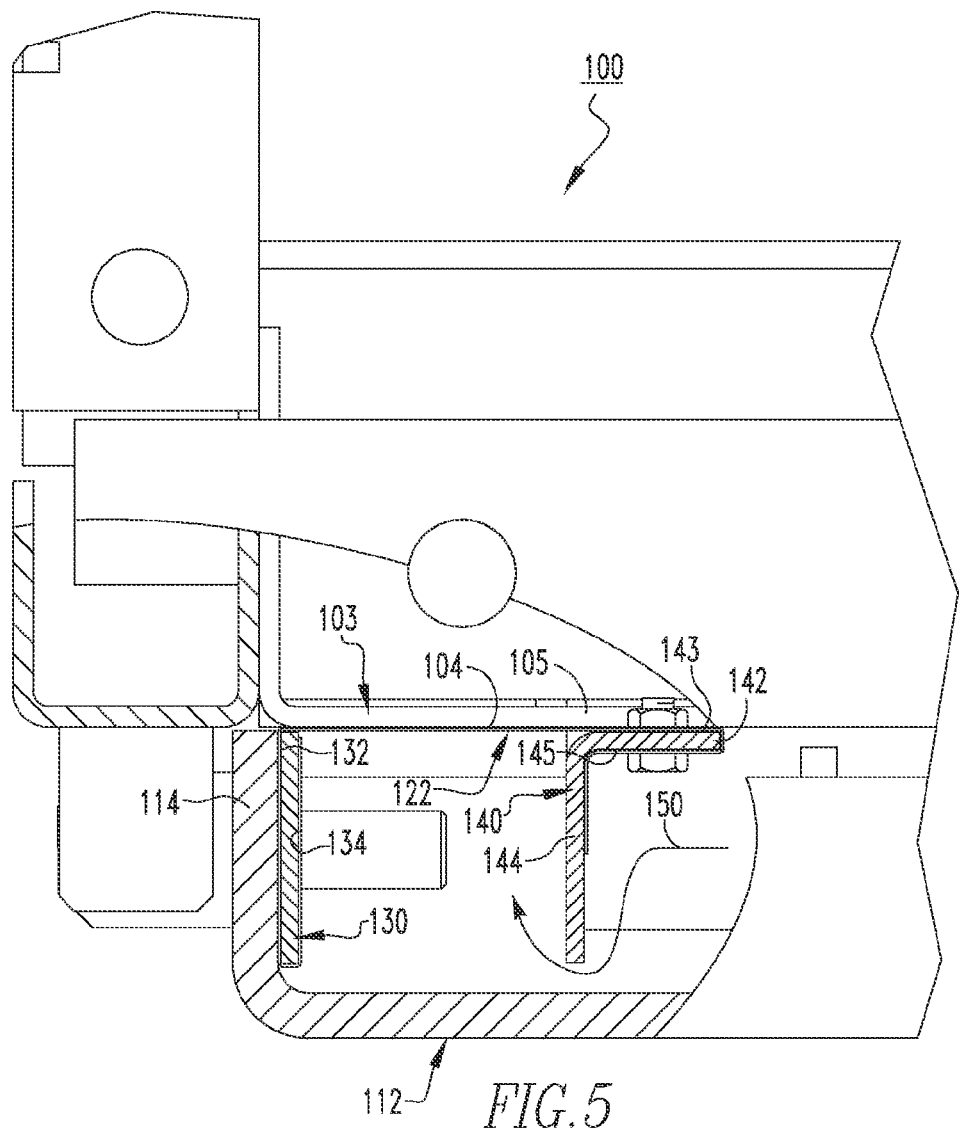
FIG. 5 is an enlarged view, partially cut away, of the electrical enclosure of FIG. 4.

FIGS. 4 and 5 show the electrical enclosure 100 with the door 112 in the closed, operating position. As shown in the cutaway view of FIG. 5, the first planar portion 142 has a first planar surface 143 and a second planar surface 145 each facing away from one another. The flexible barrier member 122 overlays both of the planar surfaces 143,145 and overlays a portion of the second planar portion 144. The first planar surface 143 securely and sealingly presses the flexible barrier member 122 into the hinge side portion 105 of the frame member 103. That is, the flexible barrier member 122 is located between the second retention member 140 (i.e., the first planar surface 143) and the hinge side portion 105 of the frame member 103. During an arc flash event, potential hot gases and debris are advantageously prevented from exiting the electrical enclosure 100 between the second retention member 140 and the frame member 103 because of this tight fitting connection. Additionally, the second planar portion 144 extends from proximate the surface 104 and is located perpendicular to the surface 104, thereby operating as a deflector against the potential hot gases and debris.

More specifically, once the potential hot gases and debris pass through the access opening of the frame member 103, they are prevented from flowing directly to the opening between the hinge side portions 105,114 by the second planar portion 144. Stated differently, the potential hot gases and debris are forced along a nonlinear potential flow path 150 around the second retention member 140, rather than directly toward the opening between the hinge side portions 105,114. By forcing the potential hot gases and debris to take the nonlinear flow path 150, the velocity with which the potential hot gases and debris approach the opening between the hinge side portions 105,114 is significantly reduced, distinct from prior art electrical enclosures in which the potential hot gases and debris pass through the access opening and move directly to the opening between the hinge side portions with a relatively large velocity.

Continuing to refer to FIG. 5, the first retention member 130 has a rectangular-shaped cross-section (i.e., is flat) and has a first planar surface 132 and a second planar surface 134 each facing away from one another. As shown, the first planar surface 132 securely and sealingly presses the flexible barrier member 122 into the hinge side portion 114 of the door 112. That is, the flexible barrier member 122 is located between the first retention member 130 (i.e., the first planar surface 132) and the hinge side portion 114 of the door 112. Additionally, because the flexible barrier member 122 is substantially impervious to the flow of hot gases and debris therethrough, the potential hot gases and debris given off during a potential arc flash event that follow the flow path 150 will be prevented from exiting the electrical enclosure through the opening between the hinge side portions 105, 114. More specifically, the flexible barrier member 122 extends across (i.e., covers and/or blocks) this opening between the hinge side portions 105,114 and thereby operates as a seal. This is distinct from prior art electrical enclosures in which there is an open air pathway from an interior of the electrical enclosure through the space between respective hinge side portions.

Figure 6:
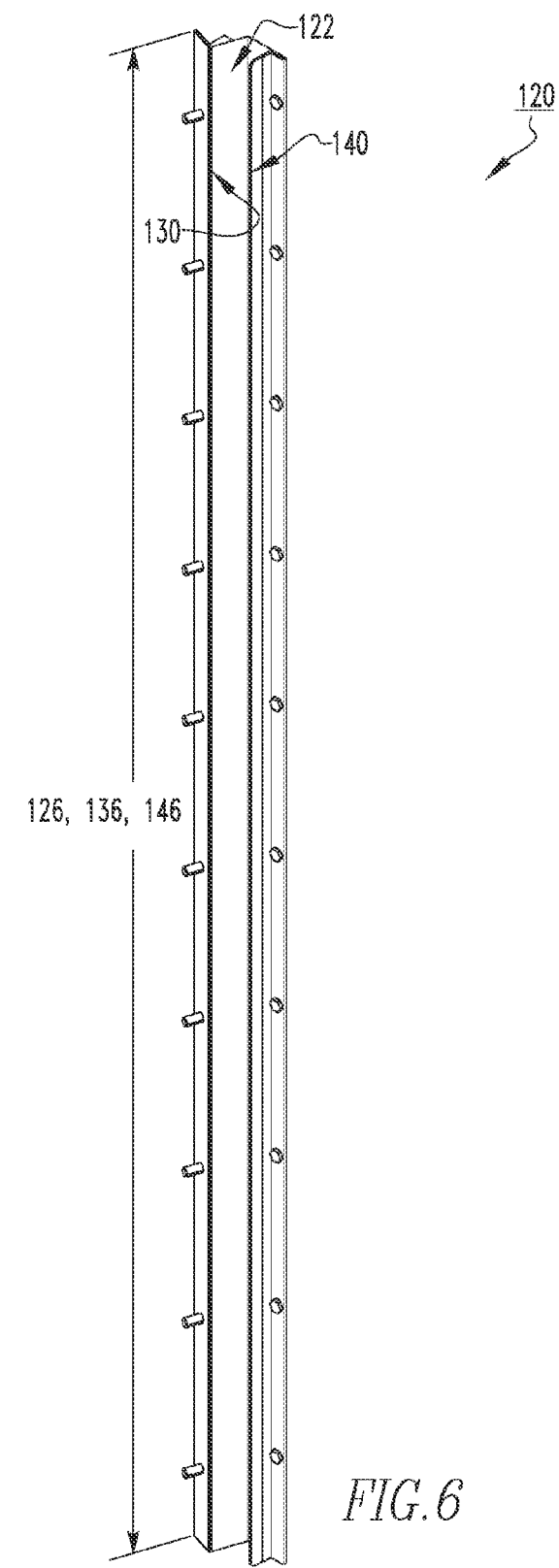
FIG. 6 is an isometric view of containment apparatus for the electrical apparatus and electrical enclosure therefor of FIG. 1.
Figure 7:
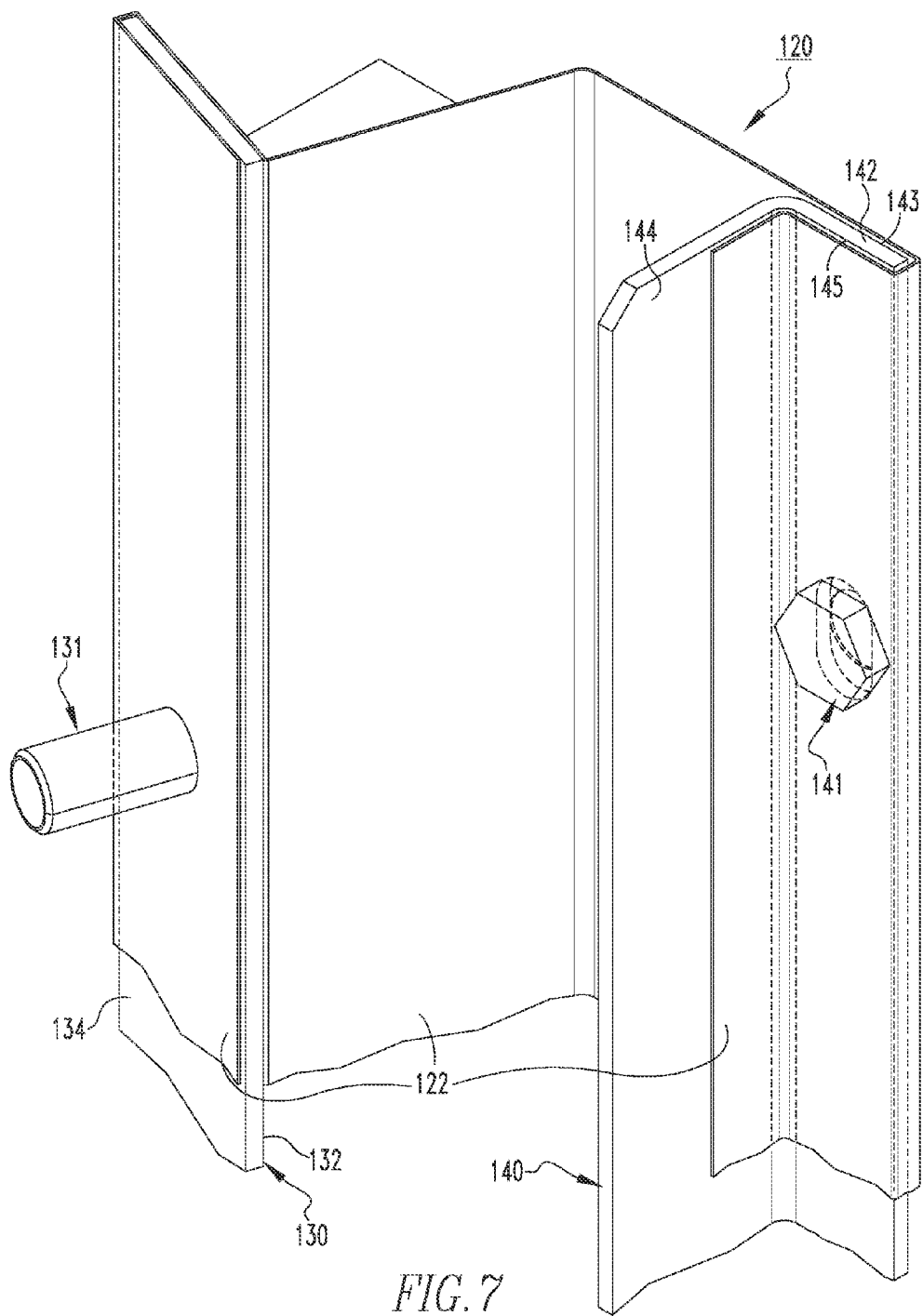
FIG. 7 is an enlarged view of the containment apparatus of FIG. 6.

FIGS. 6 and 7 show front isometric views of the containment apparatus 120. As shown, the flexible barrier member 122 has a longitudinal length 126, the first retention member 130 has a longitudinal length 136, and the second retention member 140 has a longitudinal length 146. The lengths 126,136,146 are all the same as one another. Referring again to FIG. 1, the hinge side portions 105,114 each have respective longitudinal lengths 106,116 the same as the lengths 126,136,146 (FIG. 6). In other words, in the exemplary non-limiting embodiment, the containment apparatus 120 extends along the entire longitudinal length of the hinge side portions 105,114.

Additionally, as shown in FIG. 7, the flexible barrier member 122 overlays the first and second surfaces 132,134, the first and second surfaces 143,145, and a portion of the second portion 144 of the second retention member 140. It will be appreciated that the disclosed structure prevents the flexible barrier member 122 from being blown through the opening between the hinge side portions 105,114 in the event of an arc flash. That is, having the flexible barrier member 122 wrap around the first retention member 130 and the second retention member 140 provides for a relatively secure connection between the flexible barrier member 122, the retention members 130,140, and the hinge side portions 105,114, thereby better retaining the flexible barrier member 122 on the hinge side portions 105,114.

Figure 8:
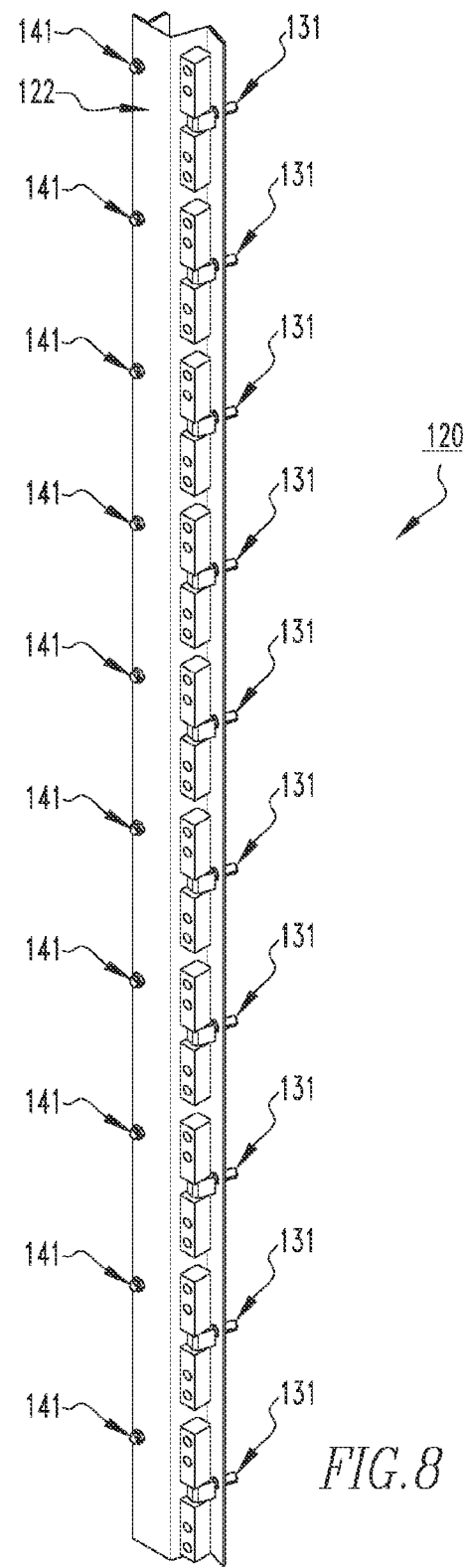
FIG. 8 is another isometric view of the containment apparatus of FIG. 6.
Figure 9:
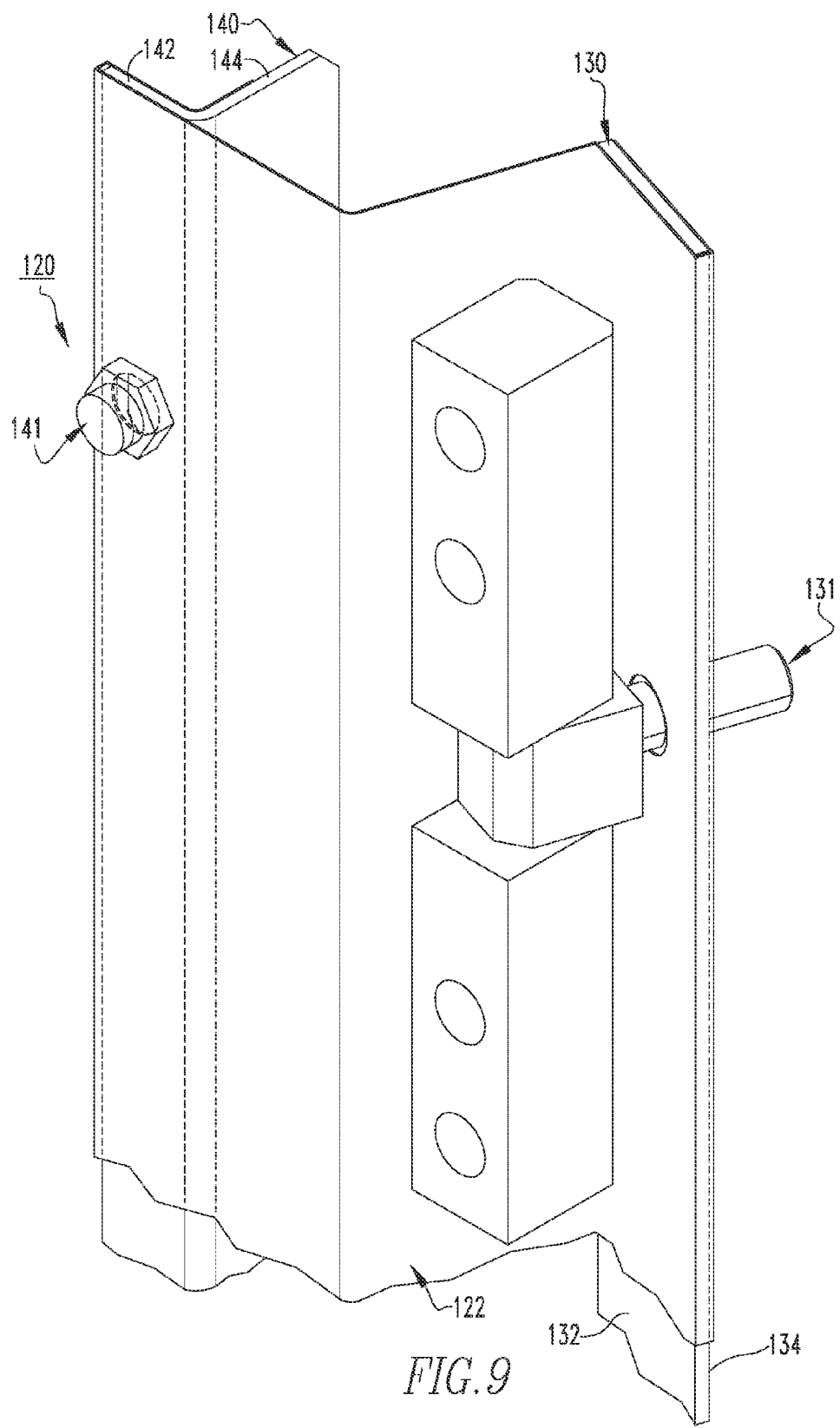
FIG. 9 is an enlarged view of the containment apparatus of FIG. 8.

Referring to FIGS. 8 and 9, the containment apparatus 120 further includes a first number of coupling members 131 and a second number of coupling members 141. In the exemplary embodiment, the coupling members 131,141 extend through the flexible barrier member 122 two times, extend through the respective retention members 130,140, and extend through the respective hinge side portions 105, 114 (FIG. 1) in order to retain the flexible barrier member 122 on the respective hinge side portion 105,114. It will, however, be appreciated that the containment apparatus 120 can have any suitable number and/or configuration and/or spacing of coupling members without departing from the scope of the disclosed concept.

The flexible barrier member 122 further overlays the hinge side portions 105,114 in order to provide the seal therebetween. More specifically, and with reference again to FIG. 1, the flexible barrier member 122 includes a first distal end portion 127, a second distal end portion 128 located opposite and distal the first distal end portion 127, and a body portion 129 extending therebetween. The hinge side portions 105,114 each include respective first distal end portions 107,117 and respective second distal end portions 108,118 located opposite and distal the respective first distal end portions 107,117. The first distal end portions 107,117 are located proximate one another, and the second distal end portions 108,118 are located proximate one another. The first distal end portion 127 of the flexible barrier member 122 sealingly engages the first distal end portions 107,117, and the second distal end portion 128 of the flexible barrier member 122 sealingly engages the second distal end portions 108,118. The body portion 129 extends directly from the first distal end portions 107,117 to the second distal end portions 108,118 and sealingly engages the respective hinge side portions 105,114.

In other words, the body portion 129 extends along (i.e., continuously engages, covers, and/or is located on top of) the hinge side portions 105,114 from the first distal end portions 107,117 to the second distal end portions 108,118 in order to provide a seal between the hinge side portions 105,114. Likewise, the first and second retention members 130,140 extend from the first distal end portions 107,117 to the second distal end portions 108,118. As a result of the disclosed configuration, a continuous and relatively strong seal is provided across the space between the hinge side portions 105,114 along the entire length of the hinge side portions 105,114. Accordingly, in the event of an arc flash, the seal is advantageously structured to block the pathway through the opening between the hinge side portions 105, 114 at any location, and thereby prevent potential hot gases and debris from exiting the electrical enclosure 100.

Accordingly, it will be appreciated that the disclosed concept provides for an improved (e.g., without limitation, safer for operating personnel) electrical apparatus 2 and electrical enclosure 100 therefor, which among other benefits, employs a containment apparatus 120 in order to prevent hot gases and debris from exiting the electrical apparatus 2 in the event of an arc flash.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. An electrical enclosure for an electrical apparatus comprising a number of electrical components, said electrical enclosure comprising:
    a frame assembly comprising a frame member having an elongated hinge side portion;
    a door having an elongated hinge side portion disposed parallel to and proximate the hinge side portion of said frame member, said door and said frame assembly being structured to enclose said number of electrical components; and
    a containment apparatus comprising a flexible barrier member coupled to the hinge side portion of said frame member and the hinge side portion of said door in order to provide a seal therebetween; wherein the hinge side portion of said door has a first distal end portion and a second distal end portion disposed opposite the first distal end portion; wherein the hinge side portion of said frame member has a third distal end portion and a fourth distal end portion disposed opposite the third distal end portion; wherein the first distal end portion is disposed proximate the third distal end portion; wherein the second distal end portion is disposed proximate the fourth distal end portion; wherein said flexible barrier member comprises a fifth distal end portion, a sixth distal end portion disposed opposite the fifth distal end portion, and a body portion extending therebetween; wherein the fifth distal end portion engages the first and third distal end portions; wherein the sixth distal end portion engages the second and fourth distal end portions; and wherein the body portion overlays the hinge side portions of said door and said frame member.

2. The electrical enclosure of claim 1 wherein said containment apparatus further comprises at least one retention member coupled to said flexible barrier member; and wherein said at least one retention member is further coupled to a respective hinge side portion of one of said frame member and said door in order to retain said flexible barrier member thereon.

3. The electrical enclosure of claim 2 wherein said flexible barrier member is disposed between said at least one retention member and the respective hinge side portion; and wherein said containment apparatus further comprises a number of coupling members each extending through said at least one retention member, said flexible barrier member, and the respective hinge side portion in order to retain said flexible barrier member on the respective hinge side portion.

4. The electrical enclosure of claim 3 wherein said at least one retention member comprises a first planar surface and a second planar surface each facing away from one another; wherein said flexible barrier member overlays said first planar surface and said second planar surface; and wherein said first planar surface presses said flexible barrier member into the respective hinge side portion.

5. The electrical enclosure of claim 4 wherein said at least one retention member comprises a first retention member and a second retention member; wherein said number of coupling members comprises a first plurality of coupling members and a second plurality of coupling members; wherein said first plurality of coupling members extends through said first retention member, said flexible barrier member, and the hinge side portion of said door in order to retain said flexible barrier member and said first retention member on the hinge side portion of said door; and wherein said second plurality of coupling members extends through said second retention member, said flexible barrier member, and the hinge side portion of said frame member in order to retain said flexible barrier member and said second retention member on the hinge side portion of said frame member.

6. The electrical enclosure of claim 2 wherein said at least one retention member comprises a first retention member and a second retention member; wherein said first retention member has a rectangular-shaped cross-section; wherein said second retention member has an L-shaped cross-section; wherein said first retention member is coupled to the hinge side portion of said door; and wherein said second retention member is coupled to the hinge side portion of said frame member.

7. The electrical enclosure of claim 6 wherein said frame member has an access opening in order to provide access therethrough; wherein said second retention member comprises a first planar portion and a second planar portion perpendicular to said first planar portion; wherein said first planar portion presses said flexible barrier member into the hinge side portion of said frame member; wherein said second planar portion is disposed perpendicular to the hinge side portion of said frame member; and wherein said first planar portion extends from said second planar portion toward the access opening.

8. The electrical enclosure of claim 1 wherein said flexible barrier member is substantially impervious to arc flash gases and debris.

9. The electrical enclosure of claim 1 wherein said flexible barrier member is made of Kevlar.

10. An electrical enclosure for an electrical apparatus comprising a number of electrical components, said electrical enclosure comprising:
a frame assembly comprising a frame member having an elongated hinge side portion,
a door having an elongated hinge side portion disposed parallel to and proximate the hinge side portion of said frame member, said door and said frame assembly being structured to enclose said number of electrical components; and
a containment apparatus comprising a flexible barrier member coupled to the hinge side portion of said frame member and the hinge side portion of said door in order to provide a seal therebetween wherein said containment apparatus further comprises at least one retention member coupled to said flexible barrier member; wherein said at least one retention member is further coupled to a respective hinge side portion of one of said frame member and said door in order to retain said flexible barrier member thereon; wherein said at least one retention member has a first length; wherein the respective hinge side portion has a second length the same as the first length; and wherein said flexible barrier member has a third length the same as the first length and the second length.

11. An electrical apparatus comprising:
a number of electrical components; and
an electrical enclosure comprising:
a frame assembly comprising a frame member having an elongated hinge side portion,
a door having an elongated hinge side portion disposed parallel to and proximate the hinge side portion of said frame member, said door and said frame assembly enclosing said number of electrical components; and
a containment apparatus comprising a flexible barrier member coupled to the hinge side portion of said frame member and the hinge side portion of said door in order to provide a seal therebetween; wherein the hinge side portion of said door has a first distal end portion and a second distal end portion disposed opposite the first distal end portion; wherein the hinge side portion of said frame member has a third distal end portion and a fourth distal end portion disposed opposite the third distal end portion; wherein the first distal end portion is disposed proximate the third distal end portion; wherein the second distal end portion is disposed proximate the fourth distal end portion; wherein said flexible barrier member comprises a fifth distal end portion, a sixth distal end portion disposed opposite the fifth distal end portion, and a body portion extending therebetween; wherein the fifth distal end portion engages the first and third distal end portions; wherein the sixth distal end portion engages the second and fourth distal end portions; and wherein the body portion overlays the hinge side portions of said door and said frame member.

12. The electrical apparatus of claim 11 wherein said containment apparatus further comprises at least one retention member coupled to said flexible barrier member; and wherein said at least one retention member is further coupled to a respective hinge side portion of one of said frame member and said door in order to retain said flexible barrier member thereon.

13. The electrical apparatus of claim 12 wherein said flexible barrier member is disposed between said at least one retention member and the respective hinge side portion; and wherein said containment apparatus further comprises a number of coupling members each extending through said at least one retention member, said flexible barrier member, and the respective hinge side portion in order to retain said flexible barrier member on the respective hinge side portion.

14. The electrical apparatus of claim 13 wherein said at least one retention member comprises a first planar surface and a second planar surface each facing away from one another; wherein said flexible barrier member overlays said first planar surface and said second planar surface; and wherein said first planar surface presses said flexible barrier member into the respective hinge side portion.

15. The electrical apparatus of claim 14 wherein said at least one retention member comprises a first retention member and a second retention member; wherein said number of coupling members comprises a first plurality of coupling members and a second plurality of coupling members; wherein said first plurality of coupling members extends through said first retention member, said flexible barrier member, and the hinge side portion of said door in order to retain said flexible barrier member and said first retention member on the hinge side portion of said door; and wherein said second plurality of coupling members extends through said second retention member, said flexible barrier member, and the hinge side portion of said frame member in order to retain said flexible barrier member and said second retention member on the hinge side portion of said frame member.

16. The electrical apparatus of claim 12 wherein said at least one retention member comprises a first retention member and a second retention member; wherein said first retention member has a rectangular-shaped cross-section; wherein said second retention member has an L-shaped cross-section; wherein said first retention member is coupled to the hinge side portion of said door; and wherein said second retention member is coupled to the hinge side portion of said frame member.

17. The electrical apparatus of claim 16 wherein said frame member has an access opening in order to provide access therethrough; wherein said second retention member comprises a first planar portion and a second planar portion perpendicular to said first planar portion; wherein said first planar portion presses said flexible barrier member into the hinge side portion of said frame member; wherein said second planar portion is disposed perpendicular to the hinge side portion of said frame member; and wherein said first planar portion extends from said second planar portion toward the access opening.

18. The electrical apparatus of claim 11 wherein said electrical apparatus is a motor starter.

* * * * *